United States Patent [19]

Kawagoe et al.

[11] 4,320,355
[45] Mar. 16, 1982

[54] SWEEP SIGNAL GENERATION SYSTEM

[75] Inventors: Katsuaki Kawagoe; Hideki Kawaji, both of Tokyo, Japan

[73] Assignee: Anritsu Electric Company Limited, Tokyo, Japan

[21] Appl. No.: 135,730

[22] Filed: Mar. 31, 1980

[30] Foreign Application Priority Data

Mar. 31, 1979 [JP] Japan .................................. 54-37742

[51] Int. Cl.³ ...................... H03L 7/12; H03B 23/00
[52] U.S. Cl. .......................................... 331/2; 331/4; 331/25; 331/178
[58] Field of Search ................. 331/2, 4, 10, 19, 22, 331/25, 31, 178

[56] References Cited

U.S. PATENT DOCUMENTS 3,320,546  5/1967  Allen et al. ............................ 331/22
3,916,334 10/1975  Hugenholtz ............................ 331/4
4,001,714  1/1977  Reed ..................................... 331/4

Primary Examiner—Siegfried H. Grimm
Assistant Examiner—Edward P. Westin
Attorney, Agent, or Firm—Holman & Stern

[57] ABSTRACT

A sweep signal generation system for producing an output sweep signal of very high frequency includes a circuit for generating an input sweep signal, and a phase locked loop which includes a phase detector, a voltage controlled oscillator and a harmonic frequency mixer. The output sweep signal is applied to the harmonic mixer together with a local oscillator signal of fixed frequency, the output from the harmonic frequency mixer being applied to the phase detector together with the input sweep signal. The output from the phase detector is applied to the voltage controlled oscillator to cause the frequency of the output thereof to be swept in accordance with variation of the input sweep signal.

7 Claims, 3 Drawing Figures

SWEEP SIGNAL GENERATION SYSTEM

BACKGROUND OF THE INVENTION

The present invention is directed toward a sweep signal generation system for producing a signal having a swept frequency. The present invention is applicable to the production of an output sweep signal of frequency in the very high radio frequency range, of the order of 4 GHz, for example.

In the following, it should be noted that the term "output sweep signal" refers to a signal whose frequency is periodically swept through a predetermined range. The term "sweep repetition signal" as used herein refers to a signal which varies in a periodic manner, as by a periodic variation in amplitude, and is applied to a sweep signal generating circuit for controlling that circuit to produce a sweep signal whose varies in accordance with the variation of the sweep repetition signal. Systems for producing sweep signals at high radio frequencies which are available at present can be broadly classified into two types. The first of these types is characterized by a sweep repetition signal driving a voltage controlled oscillator, such as a YIG tuned oscillator, in a stepless manner. The second type is typified by the use of a frequency synthesizer circuit to produce various required frequencies in a stepwise manner. The first type of system has the advantage of simplicity, but has the disadvantage of a relatively low degree of frequency stability. The second type of system provides a high degree of frequency stability, but cannot provide a continuous, stepless variation of the frequency of the output sweep signal. In order to increase the resolution of such a system, i.e. to reduce the spacing between the stepwise variations of the sweep signal frequency, it is necessary to increase the time required to perform a sweep. This makes observation of the sweep signal on a display such as a cathode ray tube difficult. The second type also has the disadvantage of complex and therefore costly circuitry.

There is therefore a requirement for a sweep signal generation system which combines relatively simple circuitry with a high degree of frequency stability, and which can provide a stepless, continuous variation in frequency of the sweep signal. These objectives are met by the present invention.

SUMMARY OF THE INVENTION

The invention includes a first sweep signal generation circuit, which produces an input sweep signal which is swept within a predetermined range of frequencies, for example 70±20 MHz. This first sweep signal generation circuit includes a standard frequency oscillator operating at the center frequency of the input sweep signal (i.e. 70 MHz for the example quoted above). Means are provided for detecting any difference between the amount of frequency deviation of the input sweep signal above the center frequency produced by this standard frequency oscillator and the frequency deviation of the input sweep signal below this center frequency, and the magnitude and direction of this difference are used to correct the operation of the oscillator which produces the input sweep signal to bring the difference in frequency deviation to zero. In this manner, although the input sweep signal is produced by a voltage controlled oscillator, the center frequency of the input sweep signal is held stable to a high degree of accuracy, by utilizing the frequency of the standard frequency oscillator as a reference value.

The invention further comprises means for producing a local oscillator signal of fixed frequency, a harmonic frequency mixer circuit, a phase detector circuit, and a second frequency controlled oscillator which produces the desired output sweep signal. The output signal from the second frequency controlled oscillator is applied to the harmonic frequency mixer together with the local oscillator signal, and an intermediate frequency signal of the sum or difference frequency between the output sweep signal and a harmonic of the local oscillator signal is thereby produced. This intermediate frequency signal is applied, together with the input sweep signal, to the phase detector, which thereby produces an output signal to control the second frequency controlled oscillator. In this manner, a phase locked loop is established whereby the frequency of the maximum or minimum frequency excursion of the output sweep signal is stabilized to that of harmonic of the local oscillator signal, while the center frequency of the output sweep signal is also accurately stabilized by means of the first swwep signal generation circuit, as described above. In this manner, a sweep signal generation system is obtained in which the output sweep signal varies in frequency in a continuous, stepwise manner, while the center frequency and degree of frequency excursion of the output sweep signal are accurately stabilized.

DESCRIPTION OF THE PREFERRED EMBODIMENTS

Figure 1:
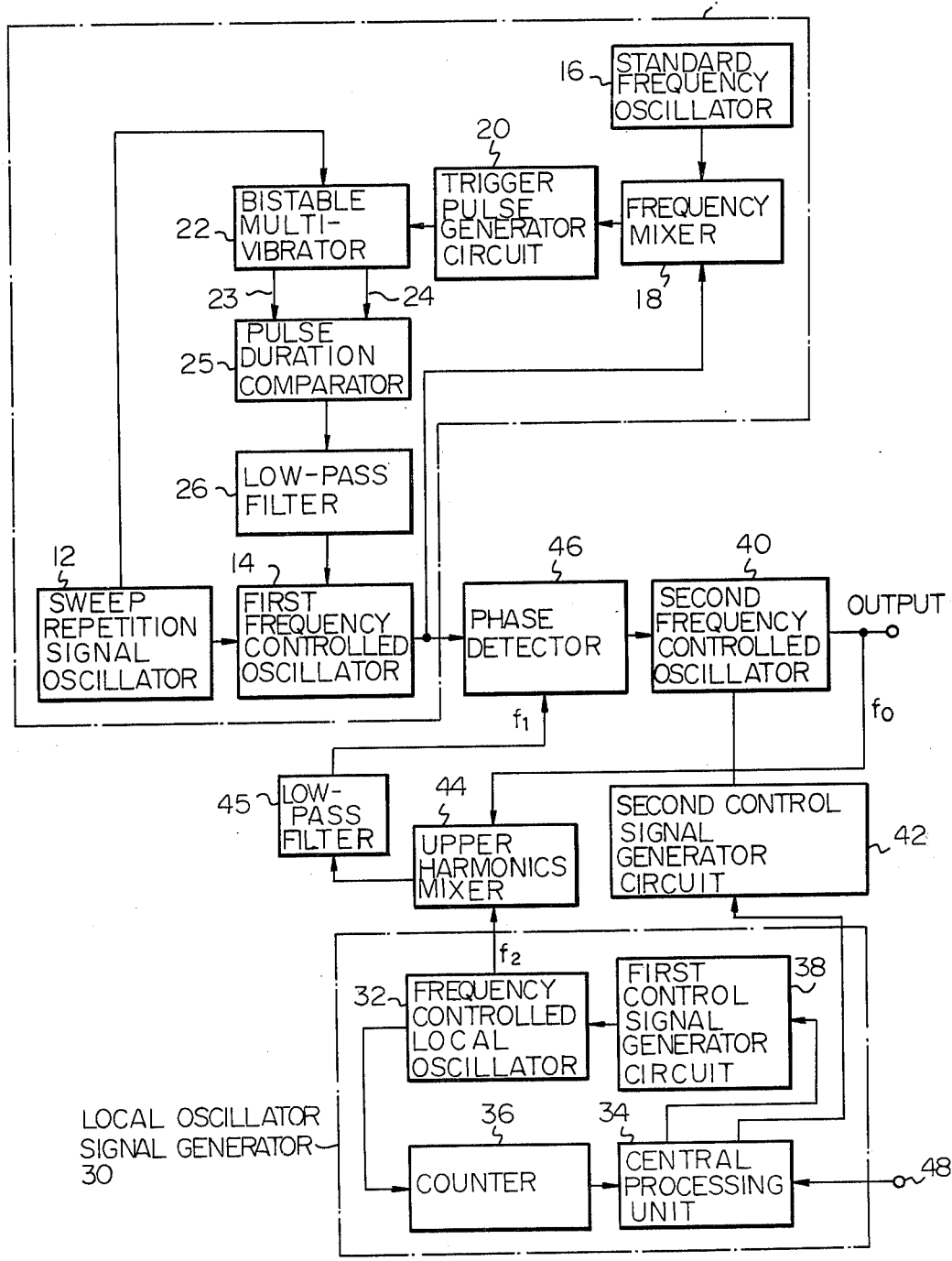
FIG. 1 is a block diagram of a first embodiment of a sweep signal generation system according to the present invention, in which the frequency of a local oscillator signal is controlled by means of a central processing unit in a digital manner.

Referring first to FIG. 1, a first preferred embodiment of a sweep signal generation system according to the present invention is shown. Numeral 10 denotes a first sweep signal generation circuit for producing a first sweep signal at a frequency of the order used as an intermediate frequency in microwave radio equipment, i.e. (70±20) MHz, for example. First sweep signal generation circuit 10 includes a sweep repetition signal oscillator 12, which produces a sweep repetition signal having a sinusoidal or triangular waveform. This sweep repetition signal is applied to a first frequency controlled oscillator 14, which would typically consist of a voltage controlled oscillator. This produces an input sweep signal which varies within a predetermined sweep range (e.g. 70±20 MHz) in accordance with the sweep repetition signal. It should be noted that the first frequency controlled oscillator 14 is not limited to being a voltage controlled oscillator, but can also comprise an oscillator whose frequency is controlled in accordance with a variation in current or other parameter of the operation sweep repetition signal. Numeral 16 denotes a standard frequency oscillator which produces an output signal whose frequency is identical to the desired center frequency of the sweep signal produced by first frequency controlled oscillator 14. This center frequency signal is combined with the input sweep signal in a frequency mixer 18, the output of which is applied to a trigger pulse generator circuit 20. When the frequency of the input sweep signal coincides with that of the center frequency signal from the standard frequency oscillator 16, then the resultant zero-frequency condition of the output from frequency mixer 18 is detected by trigger pulse generator circuit 20, which thereby generates a trigger pulse. This is applied to a trigger input terminal of a bistable multivibrator 22, which has two outputs 23 and 24, providing output signals which are inverted with respect to one another. These signals are applied to a pulse duration comparator 25, which detects any difference between the pulse widths of the signals from outputs 23 and 24, and produces a control signal in response to such a difference. This control signal is applied to a frequency control input of first frequency controlled oscillator 14, such as to cause any difference in the pulse widths of the signals from terminals 23 and 24 to be reduced towards zero, by altering the timings at which trigger pulses are generated by trigger pulse generator circuit 20 through the output from frequency mixer 18.

Figure 2:
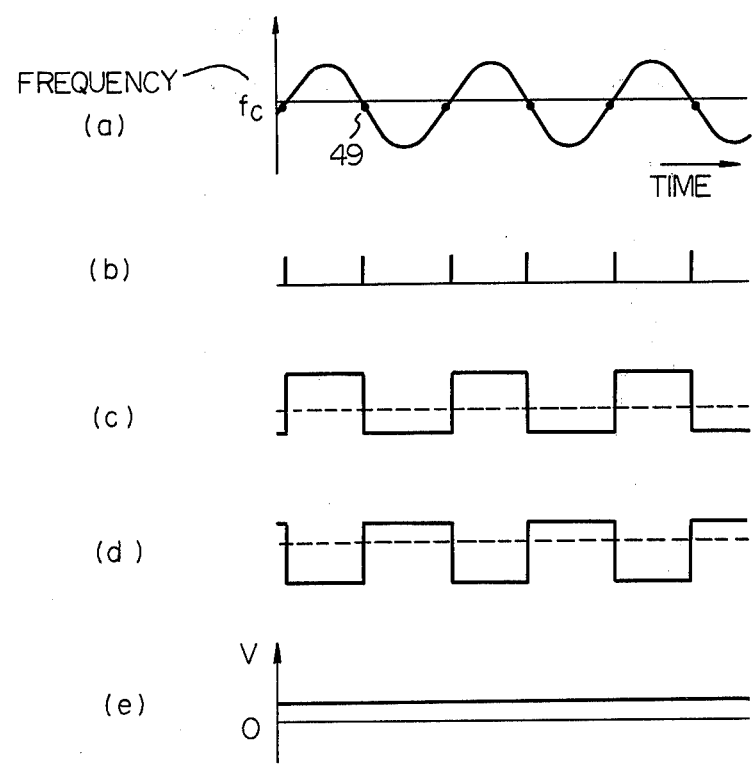
FIG. 2 is a waveform diagram illustrating the operation of the first sweep signal generating circuit in the system of FIG. 1.

The above description of the first sweep signal generation circuit 10 may be more clearly understood by reference to the waveform diagrams of FIG. 2. Here the frequency deviation of the input sweep signal is indicated at (a), as a sinusoidal waveform which varies about the center frequency referred to above, so that the frequency of the input sweep signal periodically coincides with that of the center frequency (designated as $f_c$). Such frequency coincidence conditions occur at points in time such as that designated as 49 in FIG. 2. Each time such a frequency coincidence condition occurs, then a trigger pulse is produced by trigger pulse generation circuit 20, as indicated at (b) of FIG. 2. Alternate trigger pulses trigger bistable multivibrator 22 such that outputs 23 and 24 thereof successively alternate between a high and a low potential, as indicated at (c) and (d) of FIG. 2. It will be apparent that if the time intervals between successive occurrences of the frequency coincidence condition referred to above are identical, then the pulse widths of the output signals from 23 and 24 of bistable multivibrator 22 will be identical. However, if the time intervals between alternate pairs of such frequency coincidence conditions are different, indicating that the time intervals during which the frequency of the input sweep signal is higher than that of the center frequency $f_c$ are different from the time intervals during which the frequency of the input sweep signal is lower than that of the center frequency $f_c$, then there will be a corresponding difference between the pulse widths of the signals from outputs 23 and 24 of bistable multivibrator 22. This difference in pulse widths is detected by pulse duration comparator 25, which, in conjunction with the low-pass filter 26, produces a control signal as indicated at (e) of FIG. 2. The amplitude of this control signal depends upon the degree of difference between the duration of output pulses from outputs 23 and 24 of bistable multivibrator 22, and the polarity of the control signal is determined in accordance with whether the output pulses from output 23 or from output 24 are of longer duration. It will be apparent that these functions of the bistable multivibrator 22, pulse duration comparator 25 and low-pass filter 26 may be readily implemented by the use of well-known circuit techniques. The control signal thus produced from low-pass filter 26 is applied to control the frequency of first frequency controlled oscillator 14, such as to change the frequency in a direction which tends to return the control signal to zero, i.e. in such a direction that the successive time intervals between frequency coincidence being attained between the center frequency $f_c$ and the input sweep signal become identical in duration.

From the above description, it can be seen that the first sweep signal generation circuit includes a negative feedback loop whereby the frequency of the input sweep signal is made to vary about the center frequency $f_c$ in a symmetrical manner, i.e. such that the duration of each time interval during which the frequency of the input sweep signal deviates below the center frequency is equal to that of each time interval during which the frequency of the input sweep signal deviates above the center frequency $f_c$.

The value of center frequency $f_c$ is controlled to a high degree of stability by means of standard frequency oscillator 16, which may comprise, for example, a crystal-controlled oscillator operating at a frequency of the order of 70 MHz.

Referring again to FIG. 1, numeral 30 denotes a local oscillator signal generator circuit, which produces a local oscillator signal of fixed frequency, denoted as $f_2$. Local oscillator signal generator 30 comprises a central processing unit 34, which produces a first output signal that is applied to a first control signal generator circuit 38, and a second output signal which is applied to a second control signal generator circuit 42. Each of these output signals from central processing unit 48 comprises a digital signal, and each of first and second control signal generator circuits 38 and 42 comprises a digital-to-analog converter circuit in this embodiment of the present invention, for producing an analog control signal used for frequency control purposes. The control signal from first control signal generator circuit 38 is applied to a frequency controlled local oscillator circuit 32, which is a voltage-controlled oscillator in this embodiment. The output signal from local oscillator circuit 32 is applied to one input of a harmonic frequency mixer circuit 44, and has a frequency determined by the control signal applied from first control signal generator circuit 38. An output signal from frequency controlled local oscillator 32 is also applied to a frequency counter circuit 36, which produces a digital signal representing the operating frequency of the local oscillator circuit 32. This digital signal is input to central processing unit 48, which thereby varies the digital signal applied to first control signal generator circuit 38 in such a manner that the control signal output therefrom causes the operating frequency of local oscillator 32 to be held to a predetermined value. In other words, the circuit path from the central processing unit 48 through first control signal generator circuit 38, local oscillator 32, frequency counter 36 and back to central processing unit 48 constitutes a negative feedback control loop whereby the frequency $f_2$ of the local oscillator signal is held stable to a high degree of accuracy.

Numeral 40 designates a second frequency controlled oscillator, which produces an output sweep signal of frequency designated as $f_0$. This output sweep signal is applied to the other input of harmonic frequency mixer 44, which produces an output signal containing a component whose frequency is the difference between that of the output sweep signal (i.e. $f_0$) and of a harmonic of local oscillator signal $f_2$. This frequency component is extracted, as an intermediate frequency signal, by means of a low-pass filter 45. The intermediate frequency signal is applied to one input of a phase detector circuit 46, while the input sweep signal is applied to the other input of phase detector 46. An output control signal is thereby produced by phase detector 46, in accordance with any difference in phase between the intermediate frequency signal from low-pass filter 45 and the input sweep signal. This control signal is applied to second frequency controlled oscillator 40, to control the frequency thereof such as to reduce the control signal output from phase detector 46 towards zero.

The particular harmonic of the local oscillator signal which is utilized to produce the intermediate frequency signal is determined essentially by a control signal which is produced by second control signal generator circuit 42. This latter control signal can be varied over a considerably larger range than that of the output signal from phase detector 46, in accordance with a frequency setting input signal applied to an input terminal 48 of central processing unit 34. In accordance with the value of this frequency setting input signal, central processing unit 34 produces a digital output signal which is applied to second control signal generator 42, and which is capable of effecting relatively large changes in the operating frequency of second frequency controlled oscillator circuit 40, as compared with the control range of the output signal from phase detector 46. Once a particular harmonic of the local oscillator signal has been selected, by means of the control signal from second control signal generator 42, then that control signal is left at a constant value.

It will be apparent that the action of phase detector 46 upon second frequency controlled oscillator 40 will be such as to tend to make the frequency of the intermediate frequency signal equal to that of the input sweep signal. This can be expressed mathematically in the general case in which harmonics of any of the signals involved may be utilized as:

$$mf_0 = nf_2 \pm kf_1$$

where m indicates the degree of a harmonic of frequency $f_0$, i.e. that of the output sweep signal, n the degree of a harmonic of the frequency $f_2$ (i.e. the local oscillator signal) and k is the degree of a harmonic of frequency $f_1$, i.e. that of the input sweep signal.

If we assume that the circuit is arranged such that k and m are both equal to one, then we obtain:

$$f_0 = nf_2 \pm f_1$$

The circuit constants may be arranged such that either the condition:

$$f_0 = nf_2 + f_1$$

or the condition:

$$f_0 = nf_2 - f_1$$

is selected. For the first condition, the frequency of the output sweep signal is swept about a value $nf_2 + (f_c \pm df)$, where $f_c$ is the center frequency of the input sweep signal and df is the amount of frequency deviation of the input sweep signal on each side of that center frequency. For the second of the conditions above, the frequency of the output sweep signal is swept about a value:

$$nf_2 - (f_c \pm df)$$

Since the value of center frequency $f_c$ is stabilized by means of standard frequency oscillator 16, as described hereinabove, and since the value of $f_2$ is also fixed, it will be apparent that the output sweep signal is swept about a center frequency of fixed value, by an amount which is equal to the amount of frequency deviation of the input sweep signal from first sweep signal generation circuit 10.

If, for example, the frequency of the local oscillator signal $f_2$ is fixed at 1 GHz, then an output sweep signal in the 4 GHz band can be obtained by setting the value of n to 4, i.e. by utilizing the fourth harmonic of the local oscillator signal $f_2$ to produce the intermediate frequency signal output from low-pass filter 45. Similarly, to obtain an output sweep signal in the 11 GHz band, the value of n is set to 11, i.e. the 11th harmonic of the local oscillator signal is utilized. In either case, the amount of frequency deviation of the output sweep signal is identical to that of the input sweep signal produced by first sweep signal generation circuit 10.

Figure 3:
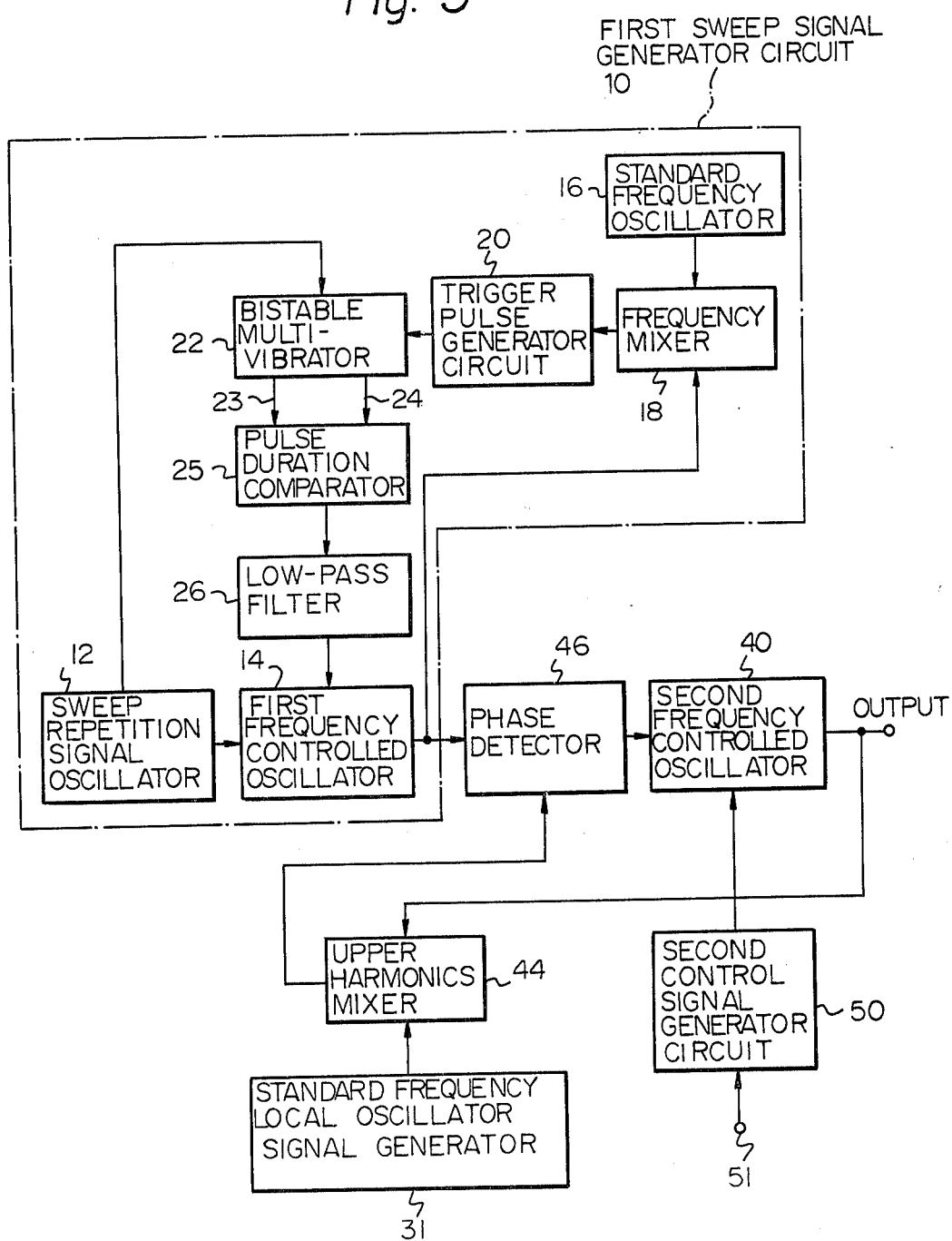
FIG. 3 is a block diagram of a second embodiment of the present invention, in which a standard frequency oscillator is used to produce a local oscillator signal.

A second embodiment of the present invention is illustrated in the block diagram of FIG. 3. In this embodiment, rather than utilizing a frequency control loop based on a central processing unit to produce the local oscillator signal, this signal is produced by a standard frequency signal generator, which may comprise a frequency synthesizer circuit for example. In other respects, the operation of this embodiment is similar to that of the first embodiment, and will therefore not be described further.

From the above description of the preferred embodiments of the present invention, it will be appreciated that the present invention provides a sweep signal generation system which offers substantial advantages over prior art sweep signal generation systems in several important respects. The frequency of the output sweep signal is swept in a continuous and stepless manner. However, in spite of the fact that frequency synthesizer techniques are not utilized to produce the output sweep signal, the amount of frequency deviation of that signal and the center frequency thereof are held to stable and accurate values by means of a phase lock loop which controls the generation of the output sweep signal in accordance with an input sweep signal of high accuracy and stability and in accordance with a local oscillator signal of fixed frequency. The present invention therefore provides the advantages which have hitherto been available only by utilizing a frequency synthesizer type of sweep signal generation system, while avoiding the disadvantages of high complexity, low sweep frequency resolution, and limitations of sweep rate which are encountered with such a conventional frequency synthesizer sweep signal generation system.

It should be noted that, although the present invention has been shown and described with respect to specific embodiments, various changes and modifications to these embodiments are possible, which fall within the scope claimed for the present invention. The description of the preferred embodiments given hereinabove should therefore be interpreted in an illustrative and not in a limiting sense.

What is claimed is:

1. A sweep signal generation system, comprising:

a source of an input sweep signal having a frequency which is swept periodically over a predetermined range of frequencies;

a frequency controlled oscillator circuit for producing an output sweep signal;

a source of a local oscillator signal of fixed frequency;

a harmonic frequency mixer circuit coupled to receive said output sweep signal and said local oscillator signal, for thereby producing an intermediate frequency signal whose frequency has a value which is equal to the difference between the frequencies of said output sweep signal and of a harmonic of said local oscillator signal; and a phase detector circuit coupled to receive said input sweep signal and said intermediate frequency signal for producing a control signal having a value which is determined by the magnitude of a difference in phase between said input sweep signal and said intermediate frequency signal;

said control signal being applied to said frequency controlled oscillator circuit for controlling the frequency of oscillator thereof such as to reduce said phase difference between said input sweep signal and said intermediate frequency toward zero, whereby the frequency of said output sweep signal is swept by a frequency deviation equal to that of said input sweep signal, in relation to the frequency of said harmonic of said local oscillator signal.

2. A sweep signal generation system according to claim 1, wherein said source of an input sweep signal comprises:

a sweep repetition oscillator circuit for producing a sweep repetition signal of predetermined period;

a frequency controlled oscillator circuit responsive to said sweep repetition signal for producing said input sweep signal, said input sweep signal being swept periodically about a predetermined center frequency with a sweep repetition rate and a frequency deviation controlled by said sweep repetition signal;

a standard frequency oscillator circuit for producing an output signal of fixed frequency which is identical to said center frequency of said input sweep signal;

a frequency mixer circuit coupled to receive said output signal from said standard frequency oscillator circuit and said input sweep signal;

a trigger pulse generation circuit coupled to receive an output signal produced by said frequency mixer circuit, to detect a condition in which the frequency of said mixer circuit output signal attains a value of zero when the frequency of said input sweep signal becomes equal to said center frequency, and for producing a trigger pulse when said zero frequency condition is detected;

a bistable multivibrator circuit responsive to successive ones of said trigger pulses for alternately setting each of a pair of output terminals thereof to a high potential and a low potential, with the potentials of said pair of output terminals being inverted with respect to one another, whereby pulse trains of mutually opposite phase are produced from said pair of output terminals; and pulse duration comparator means for comparing the durations of pulses produced by one of said pair of output terminals of said bistable multivibrator circuit with the durations of pulses produced by the other of said pair of output terminals, and for producing an output signal of magnitude determined in accordance with said difference in pulse durations;

said output signal from said pulse duration comparator means being applied to said frequency controlled oscillator of said input sweep signal source to control the frequency of operation of said frequency controlled oscillator such as to cause said difference in pulse durations to tend toward zero, thereby causing said frequency controlled oscillator to produce said input sweep signal such that the frequency thereof successively deviates above and below said predetermined center frequency respectively during alternate time intervals of identical duration.

3. A sweep signal generation system according to claim 1, wherein said local oscillator signal source comprises:

a frequency controlled local oscillator circuit for producing said local oscillator signal;

a frequency counter coupled to receive said local oscillator signal, for counting the frequency thereof;

a central processing unit for receiving an output from said frequency counter indicative of said local oscillator signal frequency, for detecting any deviation of said local oscillator signal frequency from a predetermined frequency value, and for producing an output digital signal indicative of the value of said frequency deviation; and control signal generator circuit means responsive to said output digital signal from said central processing unit for producing a control signal which is applied to said frequency controlled local oscillator circuit such as to reduce said frequency deviation of said local oscillator signal frequency toward a value of zero.

4. A sweep signal generation system according to claim 3, wherein said central processing unit is further responsive to a frequency setting input signal for producing another digital output signal, and further comprising another control signal generator circuit responsive to said another digital output signal for producing another control signal, said another control signal being applied to said frequency controlled oscillator producing said output sweep signal, whereby the frequency of said output sweep signal is set to be close to the frequency of a harmonic of said local oscillator signal, said harmonic being determined by a value of said frequency setting input signal.

5. A sweep signal generation system according to claim 3, in which said output sweep signal frequency controlled oscillator comprises a voltage controlled oscillator circuit, and in which said control signal generator circuit means comprises a digital-to-analog converter circuit for producing an analog control signal.

6. A sweep signal generation system according to claim 1, in which said local oscillator signal source comprises a frequency synthesizer circuit.

7. A sweep signal generation system according to claim 2, in which said standard frequency oscillator circuit comprises a crystal controlled oscillator circuit.

* * * * *